United States Patent [19]

Leeke

[11] Patent Number: 5,757,678
[45] Date of Patent: May 26, 1998

[54] METHOD OF SIMULTANEOUS SIMULATION OF A COMPLEX SYSTEM HAVING SYSTEM OBJECTS, PARAMETER OBJECTS, STATE OBJECTS, AND SIMULATION OBJECTS

[75] Inventor: Steven D. Leeke, Plano, Tex.

[73] Assignee: Texas Instruments Incorporated, Dallas, Tex.

[21] Appl. No.: 474,860

[22] Filed: Jun. 7, 1995

Related U.S. Application Data

[63] Continuation of Ser. No. 958,615, Oct. 9, 1992.

[51] Int. Cl.$^6$ .................................................. G06F 19/00
[52] U.S. Cl. ........................ 364/578; 364/150; 395/500
[58] Field of Search ............................. 395/325, 375, 395/500, 600, 775, 800, 800.09, 800.21, 800.28; 364/149–156, 158, 159, 550, 578

[56] References Cited

U.S. PATENT DOCUMENTS

| | | | |
|---|---|---|---|
| 4,796,194 | 1/1989 | Atherton | 364/468 |
| 4,872,125 | 10/1989 | Catlin | 364/578 |
| 4,873,656 | 10/1989 | Catlin | 364/578 |
| 4,901,260 | 2/1990 | Lubachevsky | 364/578 |
| 4,916,647 | 4/1990 | Catlin | 364/578 |
| 5,263,149 | 11/1993 | Winlow | 395/500 |
| 5,365,463 | 11/1994 | Donath et al. | 364/578 |
| 5,375,074 | 12/1994 | Greenberg et al. | 364/578 |
| 5,442,772 | 8/1995 | Childs et al. | 395/500 |
| 5,446,870 | 8/1995 | Hinsberg, III et al. | 395/500 |

*Primary Examiner*—Michael Zanelli
*Assistant Examiner*—Edward Pipala
*Attorney, Agent, or Firm*—Robert L. Troike; Tammy L. Williams; Richard L. Donaldson

[57] ABSTRACT

Simulation of a complex system begins by generating a plurality of system objects (12) describing items within the system through structural information within the system object (12). Each system object (12) corresponds to a plurality of parameter group objects (18, 20, 22), and a plurality of state objects (24, 26, 28) associated therewith. Each system object (12) also corresponds to a plurality of simulation objects (30, 32, 34) representing specific simulations of the complex system. Each simulation object (30) associates with a parameter group object (18) and a state object (24). Each object is indexed by an object identifier (OID) and parameter group and state objects are further indexed by their corresponding simulation object identifier. Structural, parameter, and state information are separated within their own individual objects allowing multiple threads of system configuration to be run through the simulation objects simultaneously for parallel comparison of simulation results.

1 Claim, 1 Drawing Sheet

METHOD OF SIMULTANEOUS SIMULATION OF A COMPLEX SYSTEM HAVING SYSTEM OBJECTS, PARAMETER OBJECTS, STATE OBJECTS, AND SIMULATION OBJECTS

This is a continuation of application Ser. No. 07/958,615 filed Oct. 9, 1992.

TECHNICAL FIELD OF THE INVENTION

This invention relates in general to manufacturing processes and more particularly to a method of simulating operation of a complex system.

BACKGROUND OF THE INVENTION

Simulation techniques provide a manner in which a complex system can be modeled in order to compare results from running the model with actual results observed from the complex system. An example of a complex system is a distributed manufacturing plant capable of fabricating a variety of products through ordered sequences of process steps. Distributed factories consist of heterogeneous, unconnected work stations capable of adapting to a varying product mix but resulting in complexity of operations, management, and quality control. Distributed factories are common in the manufacture of modern electronics products. Various types of distributed factories can be involved in the manufacture of modern electronics products such as wafer slicing, wafer fabrication, semiconductor component assembly, circuit board fabrication, circuit board assembly, and electronic product assembly.

The typical example of a distributed factory is a wafer fabrication plant which may manufacture products simultaneously according to over 1,000 processes, each averaging over 100 steps. Such a large number of processes is difficult to represent in a fabrication graph but can be described in a computer system. However, discrete event computer simulation of a wafer fabrication plant is a complicated process. A very large number of parameters exist, usually well over 10,000 parameters, that can be changed in the simulation model to effect its behavior. As a result, simulation as an analysis technique is difficult and time consuming to use effectively. The natural outcome in such a situation is that simulation is either not used, or worse yet, it is used incorrectly. In many cases, too few simulations are run to arrive at statistically valid results.

Existing simulation languages and systems, such as SLAM, SIMSCRIPT, SIMON, and GPSS, implicitly combine state and structure information allowing only a single thread of control, i.e. simulation, to be active at any one time. Though most simulation software can run on multiple processors, simulations can only be run in serial fashion. In most cases, the data from each simulation is stored externally from the simulation model representation, thus making it difficult to have a detailed comparison of simulation results. Therefore, it is desirable to simulate a distributed factory by separating state and structure information to allow for multiple threads of control and simulations to be run simultaneously for parallel comparative analysis.

From the foregoing, it may be appreciated that a need has arisen for a method of simulating a complex system that separates state and structure information and allows for multiple simulation runs to occur in parallel to speed the completion of statistically significant experimental results. Further, a need has arisen for a method of simulating a complex system that allows for comparison of simulation results through indexing of state, structure, and parameter information.

SUMMARY OF THE INVENTION

In accordance with the present invention, a method of simulating a complex system is provided which substantially eliminates or reduces disadvantages and problems associated with prior simulation techniques.

The present invention includes the step of defining the complex system as a plurality of objects. Structure, state, and parameter information are distributed into separate objects defining the complex system. Simultaneous simulations of the complex system occur in multiple threads of system configurations established through the plurality of objects. Further, each object has a unique identifier for indexing purposes to allow easy access for changes in system configurations among different simulations and control of comparative analysis of the simulations.

The present invention provides various technical advantages over other simulation techniques within the prior art. One technical advantage is in having a simulation technique which has separate state, structure, and parameter information representations. Another technical advantage is in forming multiple threads of control for parallel processing of simulation runs. Yet another technical advantage is in indexing the information representations to allow easy access to complex system information and provide effective comparative analysis of simulation results. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
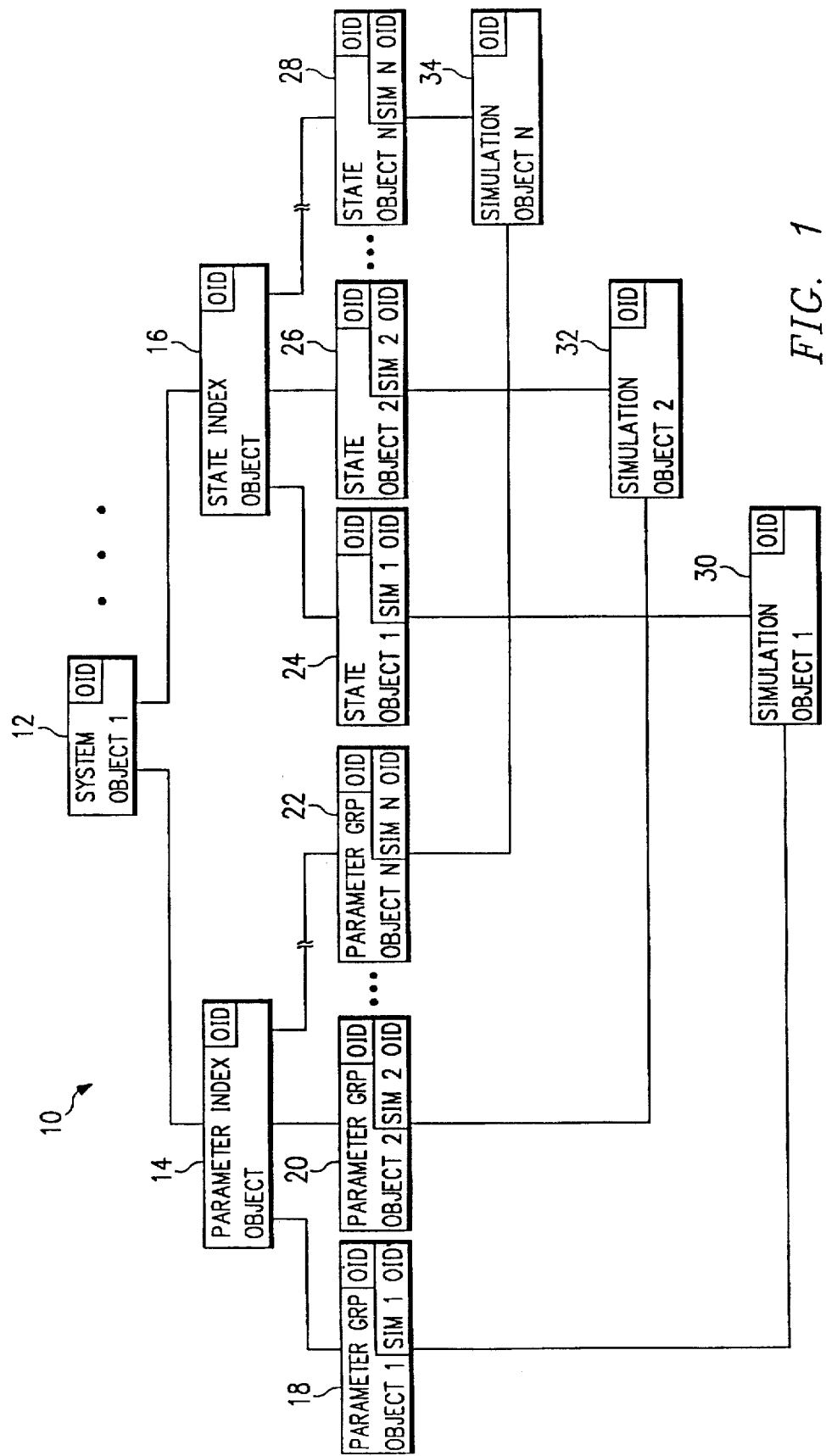
FIG. 1 is a block diagram of a representation of a complex system.

FIG. 1 illustrates a block diagram of an object oriented representation 10 of a complex system according to the present invention. System object 1 block 12 is a representation of an actual item within the complex system. Other system object blocks, not shown, correspond to other items within the complex system. Using a wafer fabrication factory as an example of a complex system, system object 12 may represent a machine within the factory. System object 1 block 12 is separated into a parameter index object block 14 and state index object block 16. Parameter index object block 14 is further separated into parameter group object 1 block 18, parameter group object 2 block 20, and so on up to parameter group object N block 22. State index object block 16 further separates into state object 1 block 24, state object 2 block 26, and so on up to state object N block 28. Each and every parameter group object block and state object block ties to a corresponding simulation object block such that parameter group object 1 block 18 and state object 1 block 24 corresponds to simulation object 1 block 30, parameter group object 2 block 20 and state object 2 block 26 corresponds to simulation object 2 block 32, and ending with parameter group object N block 22 and state object N block 28 corresponding to simulation object N block 34.

According to the present invention, a complex system such as a wafer fabrication factory is viewed as a set of objects and their relationships. Each item in the complex system is broken into a main structural representation object and collections of objects representing complete state and parametric information for the item. The objects representing the complex system are divided to allow access to each of them individually. Individual access to objects occurs by establishing an object identifier (OID) for each object. In this manner, an index is created for locating state and parametric information distributed throughout the system as a whole.

System object 1 block 12 contains structural information of an actual item within the complex system, for example the machine within the wafer fabrication factory. Placing structural data within system object 1 block 12 and establishing corresponding objects for state and parametric information achieves the goal of having separate structural, state, and parametric information representations in the system object. Parameter group object blocks 18, 20, and 22 specify values for each numeric element of the system object that may be varied and establish a particular configuration of system object 1 block 12. These values may be fixed, sampled from a random distribution, or one of a set of values that are used in round robin fashion throughout the simulation. Each parameter group object comprises parameter objects, not shown, necessary to define a configuration of system object 1 block 12 for a specific simulation. State object blocks 24, 26, and 28 specify variables for different operating states of the system object. Structure, state, and parameter information is obtained by interfacing with the complex system. In the present invention, the simulations themselves are objects. Each simulation object block 30, 32, and 34 includes the definition of a period for a simulation, a collection of events associated with the simulation, and high level data collected on the complex system during the simulation.

Each system object, parameter group object, and state object representing the complex system have their own object identifier (OID). In memory only based systems, the OID may be a standard memory pointer. In complex or distributed object oriented systems, brokered persistent object storage performs the OID function. Object relationships are represented using persistent pointers with semantic information. Semantic information allows the object relationships to have a one to one, one to N, N to N, or N to M ratio as well as to indicate location and whether create on write functions or copy on write functions should be invoked to modify the object to which it points. The OID comprises a class ID, the time stamp of creation, and a serial number. Additional OID information may consist of a process ID and a machine ID representing an ethernet address.

Each parameter group object block 18, 20, and 22 and each state object block 24, 26, and 28 have an additional identifier SIM 1 OID, SIM 2 OID, and SIM N OID, respectively, corresponding to each simulation object identifier of simulation object blocks 30, 32, and 34. The simulation object identifier is used to index distributed state and parametric information throughout the system. Thus, for any given simulation object, all state information may be found by locating all state data for each simulation and each object and likewise for all parameter information. Each simulation object block 30, 32, and 34 represents a specific thread of control that allows for multiple simulation replications each having its own parameter and state values that can be run in parallel to speed the completion of statistically significant experimental results. Distinct and different parameter and state information may be established for each thread of control represented by simulation object blocks 30, 32, and 34 allowing for system changes between threads of control to support experimentation.

An experiment represents a collection of related simulations. Each simulation object block 30, 32, and 34 represents a different simulation as established by the state object and the parameter group object corresponding to each simulation object. The relationship between simulations may be defined by a researcher through changes to parameter and state information for each simulation object or automatically generated. The ability to have multiple threads of system configuration allows for experimentation and comparative analysis of the complex system. Through parallel comparison of simulation results, unproductive threads of system configuration may be terminated without having to alter system configuration and reinitiate a simulation run.

Attached hereto and forming a part of this specification is an Appendix A comprising a source code listing written in Object C language illustrating an example of a system object, a state object, a parameter object, simulation object, and a persistent OID according to the present invention.

In summary, a simulation technique is shown that relies on object oriented representation of information. State, parametric, and structural information are separate from each other and state and parametric information are indexed for each simulation run. Unique configurations and analyses of the basic structure model of a complex system, as represented by discrete changes in parameter and state information between each simulation object, identifies unique threads of control in the model. Multiple simulations can be run simultaneously through distinct simulation objects.

Thus, it is apparent that there has been provided in accordance with the present invention, a method for simulating a complex system that satisfies the advantages set forth above. Although the preferred embodiment has been described in detail, it should be understood that various changes, substitutions, and alterations can be made herein. For example, though the present invention has been described in connection with a wafer fabrication factory, the present invention may be implemented for a variety of other complex systems. Other examples are readily ascertainable by one skilled in the art and could be made without departing from the spirit and scope of the present invention as defined by the following claims.

APPENDIX A

1. Persistent OID

```
typedef struct __tagType {
    /*
        Serial number only has to be unique to within
        the time resolution.
    */
    long        serialNum;
    INT         idNum;
    /*
        This should really be in GMT to have
        models be transportable across timezone.
    */
    long        time;
    /*
        For multi-user/multi-machine (distributed) OID's.
    */
    long        machineID;
    INT         processID;
} tagType;
typedef struct __simpleRefType {
    tagType     tag;
    struct {
        INT     referenceOnly   :   1;
        INT     createOnAccess  :   1;
```

APPENDIX A-continued

```
        INT     copyOnWrite    :  1;
    } flags;
    struct _coreType *ptr;
} simpleRefType;
2. Simulation object class _simulationType : baseType {
    /*
        Simulations generate different WIP and data.
        => the WIP and data must be indexed by simulation.
    */
    /*
        Simulation instance specific slots.
        INT                animatePattern;
        undersigned INT    delayBetEvents;
        windowRefType      simInfoWindow;
        windowRefType      traceExecWindow;
        windowRefType      traceSchedWindow;
        FILE               *traceFile;
        dateTimeType       startDateTime;
        dateTimeType       endDateTime;
        simpleRefType      eventCalendar;
        INT                interceptCnt;
};
class experimentType : baseType {
    INT              noOfMultSims;
    INT              simCnt;
    Boolean          NewSeeds;
    simpleRefType    seedGen;
    /*
        The set of simulations to run.
    */
    simpleRefType    simulations;
};
3. System object class machineType : equipmentType {
    simpleRefType          lastUnitProcess;
    /*
                           Overrides slots
    */
    machineSpecOverrideType overrides;
};
class machineSpecType : equipmentSpecType {
    /*
        Override slots
    */
    machineSpecOverrideType  overrides;
    struct {
        simpleRefType    fixedTime;
        simpleRefType    variableTime;
    } load;
    struct {
        simpleRefType    fixedTime;
        simpleRefType    variableTime;
    } unload;
    struct {
        struct {
            simpleRefType    fixedTime;
            simpleRefType    variableTime;
        } setup;
        struct {
            simpleRefType    fixedTime;
            simpleRefType    variableTime;
        } setdown;
    } standard;
    /*
        Simulations generate different WIP and data.
        =>the WIP and data must be indexed by simulation.
    */
};
struct typedef _machineSpecOverrideType {
    /*
        Override slots
    */
    simpleRefType    unitProcesses;
    simpleRefType    defaultUnitProcess;
    simpleRefType    upstreamDiscipline;
    struct {
        struct {
            simpleRefType    fixedTime;
            simpleRefType    variableTime;
        } setup;
        struct {
            simpleRefType    fixedTime;
            simpleRefType    variableTime;
        } setdown;
    } conditional;
} machineSpecOverrideType;
class equipmentType : referenceType {
    /*
        Override slots.
    */
    /*
        Local data.
    */
    dateTimeType       purchaseDate;
    /*
        Simulations generate different WIP and data.
        =>the WIP and data must be indexed by simulation.
        Data objects Group indexed by simulation.
    */
    simpleRefType    data;
};
class equipmentSpecType : baseType {
    /*
        Override slots
    */
    equipmentSpecOverrideType  overrides;
    FLOAT                      capitalCost;
    INT                        depreciationPeriod;
};
typedef struct _equipmentSpecOverrideType {
    /*
        Override slots.
    */
    /*
        Unscheduled Interrupts. (FAILURES)
        Only occur during processing.
    */
    simpleRefType         interrupts;
    disciplineActionType  repair;
    /*
        Unscheduled assists.
        Only occur during processing.
    */
    simpleRefType    assists;
    /*
        Scheduled availability.
    */
    simpleRefType    availability;
    /*
        Scheduled interrupts. (PM)
        Only occur during idle/down.
    */
    simpleRefType    maintenance;
} equipmentSpecOverrideType;
4. State Object class machineDataType : equipmentDataType {
    numericType    batchSize;
    numericType    setupTime;
    numericType    setdownTime;
    numericType    cycleTime;
    numericType    processTime;
    numericType    queueTime;
    /*
        Simulations generate different WIP and data.
        =>the WIP and data must be indexed by simulation.
    */
};
class equipmentDataType : baseType {
    unsigned INT     state;
    simpleRefType    inResidence;
    simpleRefType    inProcess;
    simpleRefType    inTransitTo;
    simpleRefType    queue;
    simpleRefType    activeInterrupts;
    linkedListType   pendingEvents;
```

APPENDIX A-continued

```
linkedListType      pastEvents;
numericType         downTime;
numericType         repairTime;
numericType         interruptInterval;
FLOAT               availability;
/*
    Simulations generate different WIP and data.
    =>the WIP and data must be indexed by simulation.
*/
};
5. Parameter Object class paramType : baseType {
    INT             valueKind;
    union {
        INT             integer;
        FLOAT           real;
        Boolean         boolean;
        dateTimeType    dateTime;
    } value;
    INT             units;
    simpleRefType   gen;
    setType         set;
    numericType     samples;
};
class genType : baseType {
    unsigned long   seed;
    unsigned long   randVal;
    unsigned long   lastRand;
    unsigned long   roundTable[RndShuffleSize];
    numericType     uniformSamples;
    distribType     distrib;
    numericType     distribSamples;
    tabularType     tabularDistrib;
};
```

What is claimed is:

1. A method of simulating operation of a complex system comprising the steps of:

(a) defining the complex system using a plurality of system objects, each of said system objects including information describing an item in the complex system;

(b) interfacing with the complex system to define a plurality of parameter group objects, each of said parameter group objects including parameter information associated with one of said system objects;

(c) interfacing with the complex system to define a plurality of state objects, each of said state objects including state information associated with one of said system objects;

(d) interfacing with the complex system to define a plurality of simulation objects, each of said simulation objects associated with one of said system objects through its own parameter group object and own state object and including information about a specific simulation execution of the complex system;

(e) simultaneously executing multiple threads of system configuration through said simulation objects to generate simulation results; and (f) comparing said simulation results with each other in parallel to evaluate the performance of the complex system.

* * * * *